(12) United States Patent
Xiong

(10) Patent No.: US 11,069,764 B2
(45) Date of Patent: Jul. 20, 2021

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Rui Xiong, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 160 days.

(21) Appl. No.: 16/493,498

(22) PCT Filed: Apr. 11, 2019

(86) PCT No.: PCT/CN2019/082283
§ 371 (c)(1),
(2) Date: Sep. 12, 2019

(87) PCT Pub. No.: WO2020/155390
PCT Pub. Date: Aug. 6, 2020

(65) Prior Publication Data
US 2020/0279902 A1 Sep. 3, 2020

(30) Foreign Application Priority Data

Jan. 31, 2019 (CN) .......................... 201910098524.1

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01)

(58) Field of Classification Search
CPC ............. H01L 27/3276; H01L 51/5253; H01L 51/5256
See application file for complete search history.

(56) References Cited

U.S. PATENT DOCUMENTS

2019/0305003 A1* 10/2019 Tan ...................... H01L 51/5228

FOREIGN PATENT DOCUMENTS

CN 108461530 A 8/2018

* cited by examiner

*Primary Examiner* — Kyoung Lee

(57) ABSTRACT

A display panel includes a frame region and a display region. The frame region includes a substrate, a base layer, a voltage signal trace, a planar layer, and a lead-out trace, and a packaging layer. The packaging layer extends to an outer side of the planar layer and is connected to the substrate. The display region includes an anode, and the lead-out trace extends outward from a side of the anode and overlaps the voltage signal trace. A length of an overlapping portion between the lead-out trace and the voltage signal trace is greater than a length of an orthographic projection of the overlapping portion on the substrate.

19 Claims, 1 Drawing Sheet

DISPLAY PANEL AND DISPLAY DEVICE

BACKGROUND OF INVENTION

Field of Invention

The preset invention relates to a display technology, and more particularly, to a display panel and a display device.

Description of Prior Art

With development of display technology, people are increasingly demanding high-quality display panels. For some high-resolution display panels, narrow frame display panels are required.

Referring to FIG. 1, it is a schematic view of narrow frame display panel in the prior art. There are components shown in the FIG. 1, for example, a substrate 100', a GOA driving circuit unit 101', an organic planar layer 102', an anode 103', a pixel defining layer 104', a cathode 105', a first inorganic layer 106' of a packaging layer, an organic layer 107' of a packaging layer, a second inorganic layer 108' of a packaging layer, a source/drain metal layer 109', which is a VSS signal trace, and a second blocking wall 110'.

A distance from the second inorganic layer 108' to an edge of the second blocking wall 110' is L' at the left and right frames of the panel in the FIG. 1. The greater the L' value, the greater contact area between first inorganic layer 106', the second inorganic layer 108' of the packaging layer and the substrate 100'. Since the contact area is greater, a binding force between the packaging layer and the substrate 100' is greater, and that peeling phenomenon is less likely to occur. However, in order to achieve the narrow frame display panel, it is necessary to compress the distance of L' value, which results in peeling phenomenon occurred between the packaging layer and the substrate 100'. Simultaneously, this causes poor edge packaging.

SUMMARY OF INVENTION

In one embodiment, a display panel and a display device are provided to solve the technical problem that current narrow frame display panels have a weak binding force between the packaging layer and the substrate when the frame width is compressed, which results in poor edge packaging.

A display panel includes a display region and a frame region disposed on both sides of the display region, and the frame region includes a substrate and a base layer, a voltage signal trace, a planar layer, and a lead-out trace, and a packaging layer that are sequentially disposed on the substrate, and the packaging layer extends to an outer side of the planar layer and is connected to the substrate. The display region includes the substrate and a driving circuit unit, the planar layer, and an anode that are sequentially disposed on the substrate, and the lead-out trace extends outward from a side of the anode and overlaps the voltage signal trace. A length of an overlapping portion between the lead-out trace and the voltage signal trace is greater than a length of an orthographic projection of the overlapping portion on the substrate. The base layer is provided with a plurality of trenches, and the voltage signal trace is formed on the base layer and the voltage signal trace is configured as a concave-convex structure. The display region further includes a pixel defining layer, a cathode, and the packaging layer that are disposed on the anode. The packaging layer corresponding to the display region includes a first inorganic layer, an organic layer, and a second inorganic layer that are disposed on the cathode.

In one embodiment, the lead-out trace is configured as a concave-convex structure and is overlapped with the voltage signal trace.

In one embodiment, the packaging layer comprises a first inorganic layer disposed on the lead-out trace, and an overlapping region of the first inorganic layer and the lead-out trace is configured as a concave-convex structure.

In one embodiment, the base layer is an insulating organic layer or an insulating inorganic layer.

In one embodiment, the voltage signal trace is a VSS trace or a VDD trace.

A display panel includes a display region and a frame region disposed on both sides of the display region, and the frame region includes a substrate and a base layer, a voltage signal trace, a planar layer, a lead-out trace, and a packaging layer that are sequentially disposed on the substrate, and the packaging layer extends to an outer side of the planar layer and is connected to the substrate. The display region includes the substrate and a driving circuit unit, the planar layer, and an anode that are sequentially disposed on the substrate, and the lead-out trace extends outward from a side of the anode and overlaps the voltage signal trace. A length of an overlapping portion of the lead-out trace and the voltage signal trace is greater than a length of an orthographic projection of the overlapping portion on the substrate.

In one embodiment, the base layer is provided with a plurality of trenches, and the voltage signal trace is formed on the base layer and the voltage signal trace is configured as a concave-convex structure.

In one embodiment, the lead-out trace is configured as a concave-convex structure and overlapped with the voltage signal trace.

In one embodiment, the packaging layer includes a first inorganic layer disposed on the lead-out trace, and an overlapping region of the first inorganic layer and the lead-out trace is configured as a concave-convex structure. The frame region further includes a first blocking wall and a second blocking wall 122 that are disposed at an end of the lead-out trace. The first blocking wall is disposed near to the display region and the second blocking wall 122 is disposed away from the display region.

In one embodiment, the base layer is an insulating organic layer or an insulating inorganic layer.

In one embodiment, the voltage signal trace is a VSS trace or a VDD trace.

In one embodiment, the display region further includes a pixel defining layer, a cathode, and the packaging layer that are disposed on the anode, and the packaging layer corresponding to the display region includes a first inorganic layer, an organic layer, and a second inorganic layer that are disposed on the cathode.

A display device includes a display panel, and the display panel includes a display region and a frame region disposed on both sides of the display region, and the frame region includes a substrate and a base layer, a voltage signal trace, a planar layer, a lead-out trace, and a packaging layer that are sequentially disposed on the substrate, and the packaging layer extends to an outer side of the planar layer and is connected to the substrate. The display region includes the substrate and a driving circuit unit, the planar layer, and an anode that are sequentially disposed on the substrate, and the lead-out trace extends outward from a side of the anode and overlaps the voltage signal trace. A length of an overlapping portion between the lead-out trace and the voltage signal trace is greater than a length of an orthographic projection of the overlapping portion on the substrate.

In one embodiment, the base layer is provided with a plurality of trenches, and the voltage signal trace is formed on the base layer and the voltage signal trace is configured as a concave-convex structure.

In one embodiment, the lead-out trace is configured as a concave-convex structure and overlapped with the voltage signal trace.

In one embodiment, the packaging layer includes a first inorganic layer disposed on the lead-out trace, and an overlapping region of the first inorganic layer and the lead-out trace is configured as a concave-convex structure.

In one embodiment, the base layer is an insulating organic layer or an insulating inorganic layer.

In one embodiment, the voltage signal trace is a VSS trace or a VDD trace.

In one embodiment, the display region further includes a pixel defining layer, a cathode, and the packaging layer that are disposed on the anode, and the packaging layer corresponding to the display region includes a first inorganic layer, an organic layer, and a second inorganic layer that are disposed on the cathode.

Compared the display panel and the display device according to the embodiment of the present invention with conventional narrow frame display panels, a length of an overlapping between of the lead-out trace and the voltage signal trace is greater than a length of an orthographic projection of the overlapping portion on the substrate, so a length of projection of the voltage signal trace on the substrate is reduced. Thus, it is not necessary to reduce a distance from an edge of the packaging layer to an edge of the second blocking wall when a width of panel frame is reduced. Therefore, the technical problem that the current narrow frame display panel has a weak binding force between the packaging layer and the substrate when the frame width is compressed, which results in poor edge packaging, is solved.

BRIEF DESCRIPTION OF DRAWINGS

In order to more clearly illustrate embodiments or the technical solutions, drawings used in the embodiments will be briefly described below. The drawings in the following description are only partial embodiments, and a skilled person in the art can obtain other embodiments according to the drawings without effort.

DETAILED DESCRIPTION OF PREFERRED EMBODIMENTS

Figure 1:
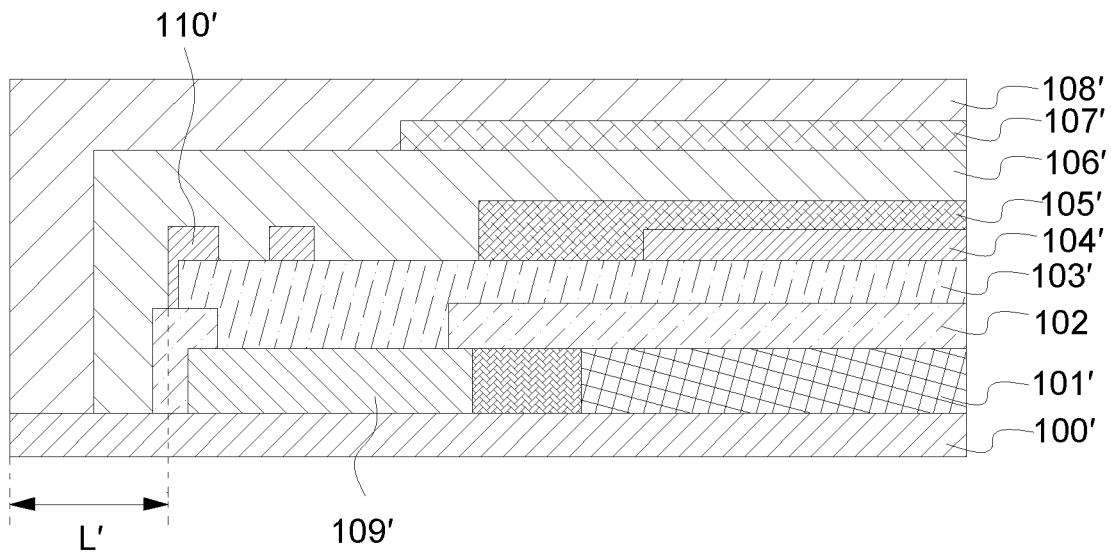
FIG. 1, is a schematic view of narrow frame display panel in the prior art.

Please refer to the attached drawings, in which the same reference numeral represents the same component. The following description is based on specific embodiments of the present invention as illustrated, and should not be construed as limiting the specific embodiments that are not described herein.

Figure 2:
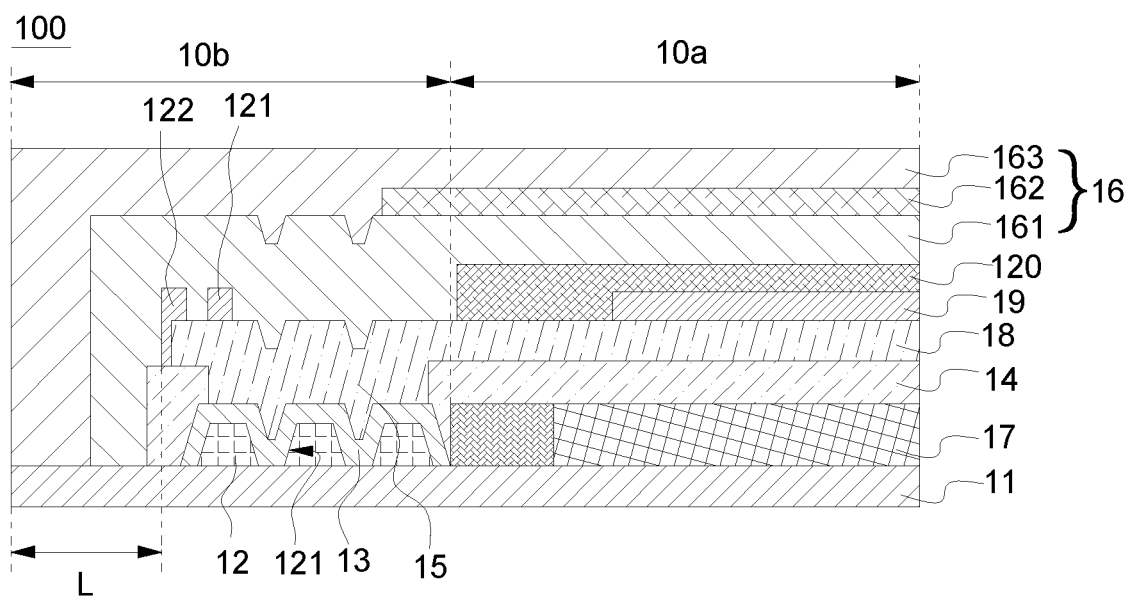
FIG. 2 is a schematic view of a display panel according to one embodiment of the present invention.

Referring FIG. 2, it is a schematic view of a display panel according to one embodiment of the present invention. The display panel 100 includes display region 10*a* (a part of the display panel shown in the FIG. 2) and a frame region 10*b* disposed on both sides of the display region 10*a*.

The frame region 10*b* includes a substrate 11 and a base layer 12, a voltage signal trace 13, a planar layer 14, a lead-out trace 15, and a packaging layer 16 that are sequentially disposed on the substrate 11. The packaging layer 16 extends from the display region 10*a* to an outer side of the planar layer 14 and is connected to the substrate 11.

The display region 10*a* includes a substrate 11 and a driving circuit unit 17, a planar layer 14, an anode 18, a pixel defining layer 19, cathode 120, and a packaging layer 16 that are sequentially disposed on the substrate 11. The packaging layer 16 corresponding to the display region 10*a* includes a first inorganic layer 161, an organic layer 162, and a second inorganic layer 163 that are disposed on the anode 120.

The lead-out trace 15 extends outward from a side of the anode 18 and overlaps the voltage signal trace 13.

A length of an overlapping portion between the lead-out trace 15 and the voltage signal trace 13 is greater than a length of an orthographic projection of the overlapping portion on the substrate 11.

In the display panel 100, a length of an overlapping portion between the lead-out trace 15 and the voltage signal trace 13 is greater than a length of an orthographic projection of the overlapping portion on the substrate 11, so a length of projection of the voltage signal trace 13 on the substrate 11 is reduced. Thus, it is not necessary to reduce a distance L from an edge of the packaging layer 16 to an edge of the second blocking wall 122 when a width of panel frame is reduced.

In the display panel 100, the base layer 12 is provided with a plurality of trenches 121. The plurality of trenches 121 are disposed at interval from each other. The voltage signal trace 13 is formed on the base layer 12, and thus the voltage signal trace 13 is present as a concave-convex structure. The voltage signal trace 13, which is a concave-convex structure, not only ensures an effective overlapping length with the lead-out trace 13 but also compresses a plane projection width of the voltage signal trace 13. Therefore, a distance L from an edge of the packaging layer 16 to an edge of the second blocking wall 122 is increased, and the frame region 12*b* of the panel is improved to have a good packaging effect.

In addition, the base layer 12 is an insulating organic layer or an insulating inorganic layer. In one embodiment, the base layer 12 is an organic layer.

The base layer 12 including an organic material can improve the frame region 12*b* to bend. A longitudinal cross-sectional shape of the voltage signal trace 13, which is a convex-concave structure, also improves a bending performance of the voltage signal trace 13. The voltage signal trace 13 may be a VSS trace or a VDD trace. It should be noted that, in the organic light emitting diode (OLED) display panel circuit, the VDD trace is connected to an anode terminal of the OLED for transmitting anode voltage, and the VSS trace is connected to a cathode terminal of the OLED for transmitting cathode voltage.

In the display panel 100, the lead-out trace 15 is present as a concave-convex structure and overlapped with the voltage signal trace such that the lead-out trace 15 and the voltage signal trace 13 are sufficiently overlapped to achieve a maximum overlap length of the lead-out trace 15 and the voltage signal trace 13.

In the display panel 100, the packaging layer 16 includes a first inorganic layer 161 disposed on the lead-out trace 15, and an overlapping region of the first inorganic layer 161 and the lead-out trace 15 is present as a concave-convex structure such that an overlapping area of the first inorganic layer 161 and the lead-out trace 15 is increased, thereby increasing a bonding area of the first inorganic layer 161 and the lead-out trace 15, and a packaging stability is also improved.

A portion of the packaging layer 16 corresponding to the overlapping region further includes a second inorganic layer 163. The second inorganic layer 163 is formed on the first inorganic layer 161. In the portion corresponding to the overlapping region, the first inorganic layer 161 is fittingly overlapped with the second inorganic layer 163 such that such that an overlapping area of the first inorganic layer 161 and the second inorganic layer 163 is increased, thereby increasing a bonding area of the first inorganic layer 161 and the second inorganic layer 163, and a packaging stability is also improved.

In addition, the frame region 10b further includes a first blocking wall 121 and a second blocking wall 122 that are disposed at an end of the lead-out trace 15. The first blocking wall 121 is disposed near to the display region 10a and the second blocking wall 122 is disposed away from the display region 10a.

The display panel 100 includes a substrate 11, and a first setting region and a second setting region are disposed on the substrate 11. The display region 10a is disposed in the first setting region and the frame region 10b is disposed in the second setting region.

A process of manufacturing the display panel 100 is described as follows.

In the first step, a buffer layer, a gate metal layer, an insulating layer, an active layer, and an interlayer dielectric layer are sequentially formed on the first setting region of the substrate 11, and another interlayer dielectric layer is formed on the second setting region of the substrate 11.

In the second step, the interlayer dielectric layer corresponding to the second setting region is processed to form a base layer 12 having a plurality of trenches 121 by a halftone mask.

In the third step, a voltage signal trace 13 is formed on the base layer 12, and a source and drain metal layer is formed at the interlayer dielectric layer corresponding to the first setting region to achieve a driving circuit unit 17 disposed in the display region 10a.

In the fourth step, a planar layer 14 is formed on the driving circuit unit 17 and the voltage signal trace 13.

In the fifth step, the lead-out trace 15, a first blocking wall 121, and a second blocking wall 122 are sequentially formed on the planar layer 14 corresponding the first setting region, and an anode 18, a pixel defining layer 19, and a cathode are sequentially formed on the planar layer 14 corresponding to the second setting region.

Finally, a packaging layer 16 is formed on the above structure, so the manufacturing process is completed.

In another embodiment, a display device includes a display panel, and the display panel includes a display region and a frame region disposed on both sides of the display region, and the frame region includes a substrate and a base layer, a voltage signal trace, a planar layer, a lead-out trace, and a packaging layer that are sequentially disposed on the substrate, and the packaging layer extends to an outer side of the planar layer and is connected to the substrate, and the display region includes the substrate and a driving circuit unit, the planar layer, and an anode that are sequentially disposed on the substrate, and the lead-out trace extends outward from a side of the anode and overlaps the voltage signal trace, and a length of an overlapping portion between the lead-out trace and the voltage signal trace is greater than a length of an orthographic projection of the overlapping portion on the substrate.

In the display device, the base layer is provided with a plurality of trenches, and the voltage signal trace is formed on the base layer and the voltage signal trace is configured as a concave-convex structure.

In the display device, the lead-out trace is configured as a concave-convex structure and overlapped with the voltage signal trace.

In the display device, the packaging layer comprises a first inorganic layer disposed on the lead-out trace, and an overlapping region of the first inorganic layer and the lead-out trace is configured as a concave-convex structure.

In the display device, the base layer is an insulating organic layer or an insulating inorganic layer.

In the display device, the voltage signal trace is a VSS trace or a VDD trace.

In the display device, the display region further includes a pixel defining layer, a cathode, and the packaging layer that are disposed on the anode, and the packaging layer corresponding to the display region comprises a first inorganic layer, an organic layer, and a second inorganic layer that are disposed on the cathode.

Compared the display panel and the display device according to the embodiment of the present invention with conventional narrow frame display panels, a length of an overlapping portion between the lead-out trace and the voltage signal trace is greater than a length of an orthographic projection of the overlapping portion on the substrate, so a length of projection of the voltage signal trace on the substrate is reduced. Thus, it is not necessary to reduce a distance from an edge of the packaging layer to an edge of the second blocking wall when a width of panel frame is reduced. Therefore, the technical problem that the current narrow frame display panel has a weak binding force between the packaging layer and the substrate when the frame width is compressed, which results in poor edge packaging, is solved.

In the above, the present invention has been described in the above preferred embodiments, but the preferred embodiments are not intended to limit the scope of the invention, and a person skilled in the art may make various modifications without departing from the spirit and scope of the present invention. The scope of the present invention is determined by claims.

What is claimed is:

1. A display panel, comprising a display region and a frame region disposed on both sides of the display region, wherein the frame region comprises a substrate and a base layer, a voltage signal trace, a planar layer, a lead-out trace, and a packaging layer that are sequentially disposed on the substrate, and the packaging layer extends to an outer side of the planar layer and is connected to the substrate;

wherein the display region comprises the substrate and a driving circuit unit, the planar layer, and an anode that are sequentially disposed on the substrate, and the lead-out trace extends outward from a side of the anode and overlaps the voltage signal trace;

wherein a length of an overlapping portion between the lead-out trace and the voltage signal trace is greater than a length of an orthographic projection of the overlapping portion on the substrate;

wherein the base layer is provided with a plurality of trenches, and the voltage signal trace is formed on the base layer and the voltage signal trace is configured as a concave-convex structure;

wherein the display region further comprises a pixel defining layer, a cathode, and the packaging layer that are disposed on the anode; and wherein the packaging layer corresponding to the display region comprises a first inorganic layer, an organic layer, and a second inorganic layer that are disposed on the cathode.

2. The display panel according to claim 1, wherein the lead-out trace is present as a concave-convex structure and is overlapped with the voltage signal trace.

3. The display panel according to claim 2, wherein the packaging layer comprises a first inorganic layer disposed on the lead-out trace, and an overlapping region of the first inorganic layer and the lead-out trace is present as a concave-convex structure.

4. The display panel according to claim 1, wherein the base layer is an insulating organic layer or an insulating inorganic layer.

5. The display panel according to claim 1, wherein the voltage signal trace is a VSS trace or a VDD trace.

6. A display panel, comprising a display region and a frame region disposed on both sides of the display region, wherein the frame region comprises a substrate and a base layer, a voltage signal trace, a planar layer, a lead-out trace, and a packaging layer that are sequentially disposed on the substrate, and the packaging layer extends to an outer side of the planar layer and is connected to the substrate;
wherein the display region comprises the substrate and a driving circuit unit, the planar layer, and an anode that are sequentially disposed on the substrate, and the lead-out trace extends outward from a side of the anode and overlaps the voltage signal trace; and
wherein a length of an overlapping portion between the lead-out trace and the voltage signal trace is greater than a length of an orthographic projection of the overlapping portion on the substrate.

7. The display panel according to claim 6, wherein the base layer is provided with a plurality of trenches, and the voltage signal trace is formed on the base layer and the voltage signal trace is configured as a concave-convex structure.

8. The display panel according to claim 7, wherein the lead-out trace is present as a concave-convex structure and overlapped with the voltage signal trace.

9. The display panel according to claim 8, wherein the packaging layer comprises a first inorganic layer disposed on the lead-out trace, and an overlapping region of the first inorganic layer and the lead-out trace is configured as a concave-convex structure.

10. The display panel according to claim 7, wherein the base layer is an insulating organic layer or an insulating inorganic layer.

11. The display panel according to claim 6, wherein the voltage signal trace is a VSS trace or a VDD trace.

12. The display panel according to claim 6, wherein the display region further comprises a pixel defining layer, a cathode, and the packaging layer that are disposed on the anode; and wherein the packaging layer corresponding to the display region comprises a first inorganic layer, an organic layer, and a second inorganic layer that are disposed on the cathode.

13. A display device, comprising a display panel, wherein the display panel comprises a display region and a frame region disposed on both sides of the display region, and the frame region comprises a substrate and a base layer, a voltage signal trace, a planar layer, and a lead-out trace, and a packaging layer that are sequentially disposed on the substrate, and the packaging layer extends to an outer side of the planar layer and is connected to the substrate;
wherein the display region comprises the substrate and a driving circuit unit, the planar layer, and an anode that are sequentially disposed on the substrate, and the lead-out trace extends outward from a side of the anode and overlaps the voltage signal trace; and
wherein a length of an overlapping portion between the lead-out trace and the voltage signal trace is greater than a length of an orthographic projection of the overlapping portion on the substrate.

14. The display panel according to claim 13, wherein the base layer is provided with a plurality of trenches, and the voltage signal trace is formed on the base layer and the voltage signal trace is present as a concave-convex structure.

15. The display panel according to claim 14, wherein the lead-out trace is present as a concave-convex structure and overlapped with the voltage signal trace.

16. The display panel according to claim 15, wherein the packaging layer comprises a first inorganic layer disposed on the lead-out trace, and an overlapping region of the first inorganic layer and the lead-out trace is present as a concave-convex structure.

17. The display panel according to claim 14, wherein the base layer is an insulating organic layer or an insulating inorganic layer.

18. The display panel according to claim 13, wherein the voltage signal trace is a VSS trace or a VDD trace.

19. The display panel according to claim 13, wherein the display region further comprises a pixel defining layer, a cathode, and the packaging layer that are disposed on the anode; and wherein the packaging layer corresponding to the display region comprises a first inorganic layer, an organic layer, and a second inorganic layer that are disposed on the cathode.

* * * * *